US010001418B1

(12) United States Patent
Machir et al.

(10) Patent No.: US 10,001,418 B1
(45) Date of Patent: Jun. 19, 2018

(54) MICROMETER MECHANICAL FORCE INTERFACE

(71) Applicant: Honeywell International Inc., Morris Plains, NJ (US)

(72) Inventors: James F. Machir, Columbus, OH (US); Jason Dennis Patch, Columbus, OH (US)

(73) Assignee: Honeywell International Inc., Morris Plains, NJ (US)

( * ) Notice: Subject to any disclaimer, the term of this patent is extended or adjusted under 35 U.S.C. 154(b) by 0 days. days.

(21) Appl. No.: 15/431,502

(22) Filed: Feb. 13, 2017

(51) Int. Cl.
*G01L 1/00* (2006.01)
*G01L 1/18* (2006.01)

(52) U.S. Cl.
CPC ............... *G01L 1/005* (2013.01); *G01L 1/18* (2013.01); *H01L 2924/10253* (2013.01)

(58) Field of Classification Search
CPC .. H01L 2924/10253; G01L 1/18; G01L 1/005
USPC ........................................................ 73/862.68
See application file for complete search history.

(56) References Cited

U.S. PATENT DOCUMENTS

| 5,644,285 | A | 7/1997 | Maurer |
| 8,316,725 | B2 | 11/2012 | Wade |
| 8,806,964 | B2 | 8/2014 | Thanigachalam et al. |
| 9,003,899 | B2 | 4/2015 | Wade |
| 9,167,161 | B1 * | 10/2015 | Tam ........................ H04N 5/2253 |
| 2006/0035415 | A1 * | 2/2006 | Wood ................. H01L 27/14618 438/125 |
| 2006/0038183 | A1 * | 2/2006 | Oliver ............... H01L 27/14618 257/79 |
| 2012/0152037 | A1 * | 6/2012 | Wade ......................... G01L 1/18 73/862.627 |
| 2014/0137653 | A1 | 5/2014 | Chiou et al. |

OTHER PUBLICATIONS

Utility U.S. Appl. No. 15/388,483; Honeywell File No. H0057081 entitled : High Sensitivity Silicon Piezoresistor Force Sensor , filed Dec. 22, 2016; 26 pages.

* cited by examiner

*Primary Examiner* — Max Noori
(74) *Attorney, Agent, or Firm* — Honeywell International Inc.

(57) ABSTRACT

Embodiments generally relate to device and methods for detecting force. A force sensor may include a sense die, a substrate, one or more sense elements supported by the sense die, one or more electrical contacts located on the sense die and electrically coupled to electrical traces on the substrate, and an actuation element configured to transmit a force to the sense die. The width of the actuation element may be less than the distance between the one or more electrical contacts. In some embodiments, the actuation element may include a thin wedge/plate configured to interact with the sense die at a contact point. The thin wedge/plate may allow use of a smaller sense die and/or may allow closer placement of the one or more sense elements to the contact point and/or may prevent accidental contact with the one or more electrical contacts which may lead to a short circuit.

20 Claims, 4 Drawing Sheets

MICROMETER MECHANICAL FORCE INTERFACE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

FIELD

The present disclosure relates generally to sensors, and more particularly, to force sensors for sensing a force applied to the sensors.

BACKGROUND

In many industrial areas it may be necessary to measure the magnitude of a force. Typically, force sensors may be used to sense the force applied to the sensors and provide an output signal representative of the applied force. Various force sensor designs can be used and can rely on a displacement of a component (e.g. stress-field applied to a stress-sensitive element) to measure the presence of a force and/or an amount of the force applied on the sensor. Force sensors may be used in a wide variety of applications, such as medical applications, military applications, flight control applications, weather monitoring applications, industrial process applications, as well as many other applications.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1A:
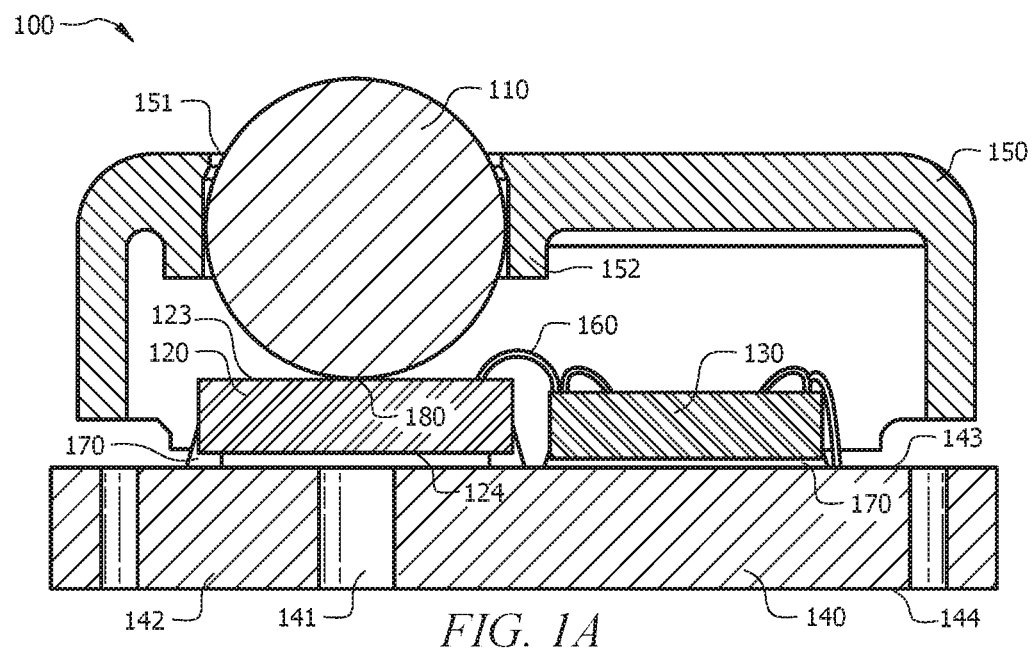
FIG. 1A illustrates a front, cross-sectional view of an exemplary embodiment of a force sensor comprising an actuation element, a sense die, a signal conditioning circuitry, a structural frame, and a substrate.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field (for example, +/−10%); and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

The embodiments of this disclosure typically relate to sensors, and more specifically, to force sensors for sensing the magnitude of a force. Typically, force sensors may be used to sense the force applied to the sensors and provide an output signal representative of the applied force. Force sensors may be used in a wide variety of applications, such as medical applications, military applications, flight control applications, weather monitoring applications, industrial process applications, as well as many other applications. Generally, various force sensor designs may be used and may rely on a displacement of a component (e.g. stress-field applied to a stress-sensitive element) to measure the presence of a force and/or an amount of the force applied on the sensor.

Conventionally, force sensors may comprise sense die. Typically, the sense die may comprise a diaphragm with one or more sense elements and one or more wire bonds positioned on the diaphragm. Additionally, the force sensor may comprise an actuation element and/or an actuation assembly. Generally, the actuation element may be configured to transmit a uniaxial force normal to the plane of the sense die. In this manner, the one or more sense elements (e.g. piezoresistive elements) having an electrical resistance that varies depending on the amount of mechanical stress applied may detect a change in force, such as a pressure, as the actuation element contacts the plane of the sense die. Generally, the actuation element may be a spherical ball bearing configured to interact with a surface of the sense die comprising one or more sense elements. Generally, the sense die may comprise wire bonds to transmit output signals to electrical traces on the substrate and/or a signal conditioning circuitry. In many cases, the size of the sense die may depend on the size of the actuation element. Thus, as the size of the sense die becomes smaller (e.g. for medical applications, for smaller packaging sizes, etc.), the size of the conventional actuation element may encroach into the area of the wire bonds. In some cases, if the actuation element comprises a metallic material and interfaces/touches the one or more wire bonds, a shortage and/or physical damage may occur to the wire bonds. This may result in the force sensor being irreparable and/or may be cost inefficient to repair. In some cases, the cross-sectional area of the actuation element may become greater than the active diaphragm area available on the sense die. Additionally, reducing the size of the conventional actuation element may increase the precision required to manufacture the structural frame of the force sensor (e.g. precision and costs required to bear, handle, and mold the thin walls of the structural frame).

Thus, disclosed embodiments may comprise an actuation element formed as a thin wedge/plate. Typically, the thin wedge/plate may comprise a thin material cross-section, and may be formed from stainless steel, a polymer, a ceramic, another suitable metal, and/or another suitable material (e.g. polymer based objects). In some cases, the thin wedge/plate may comprise a circular face with rounded edges (e.g. similar to the cylindrical shape of a coin) with the rounded edge configured to contact a surface of the sense die. In some cases, the thin wedge/plate may comprise an ovular face (e.g. with rounded edges at both ends of the actuation element). In some cases, the thin wedge/plate may comprise a square face with rounded edges at the bottom (to contact the sense die). In some cases, the thin wedge/plate may comprise a trapezoidal, triangular, or rectangular face with rounded edges at the bottom (to contact the sense die). In some cases, the thin wedge/plate may comprise a rounded edge at only one end (e.g. the end configured to contact the sense die) with the other end of the thin wedge/plate comprising a different shape (e.g. conical, rounded, flat, T-shaped, etc.). Typically, the rounded edge on at least one end of the thin wedge/plate may provide point, focalized force contact between the actuation element and the sense die. Additionally, the thin wedge/plate may vary in length to accommodate the distance between the opening/aperture of the structural frame and the contact point on the sense die. Typically, the height of the actuation element may be greater than the width of the actuation element, and the thickness of the edges may generally be less than both the height and width of the actuation element. Thus, disclosed embodiments may reduce the size of the conventional force sensor (for example, for use in smaller packaging applications), thereby reducing manufacturing costs and increasing manufacturing volume.

Typically, the one or more sense elements of a force sensor may surround the contact point between the sense die and the actuation element. Generally, the sense elements may comprise piezoresistive elements positioned at or near the center edge of a formed diaphragm. In some embodiments, there may be a small localized area of very high signal-generating stress near the actuation element. When piezoresistive elements are implanted in this location, die sensitivities may be up to 100 times greater or higher than traditional locations for the piezoresistive elements. Typically, this method of positioning the piezoresistive elements close to the actuation element may allow for a smaller sense die to be used, which may lower costs as well. In some embodiments, the sense die may not require an etched or recessed diaphragm. Instead, a "slab" die may be used. Typically, a slab die may have the advantage of significantly higher proof loads (i.e. higher overload protection), while at the same time reducing cost because it may no longer be necessary to complete the etch process to form the diaphragm. Regardless of whether a slab die is used or a sense die with a diaphragm is used, both the slab and the diaphragm may be configured to flex in response (or at least have some elastic response) to an applied force by the actuation element. Additionally, with the use of an actuation element shaped as a thin wedge/plate, the space between the sense elements (e.g. piezoresistive elements) and the actuation element may be reduced, further increasing the die sensitivities and decreasing the size of the sense die.

As described previously, the sensing die may include a diaphragm and one or more sensing elements (e.g. piezoelectric elements) positioned on the diaphragm. In some embodiments, the diaphragm may be fabricated on the sense die by back-side etching of the silicon die (e.g., with a KOH etching technique, deep reactive ion etching, or other etching technique). However, it is contemplated that any suitable process may be used, as desired. The diaphragm may have a height or thickness that is less than the thickness of the edges of the sense die, thereby forming the diaphragm.

Generally, the sense die may have one or more sense elements disposed on or adjacent to the slab die, such as piezoresistive sensing elements or components formed using suitable fabrication or printing techniques. For example, starting with the silicon sense die, standard pattern, implant, diffusion, and/or metal interconnect processes may be used to form one or more elements on a surface of the sense die. For example, one or more piezoresistive sense elements may be formed on the slab. The piezoresistive sense elements may be configured to have an electrical resistance that varies according to an applied mechanical stress (e.g. deflection of the slab). The piezoresistive elements can thus be used to convert the applied force or pressure into an electrical signal. In some instances, the piezoresistive components may include a silicon piezoresistive material; however, other non-silicon materials may be used.

In some embodiments, the sense elements (e.g. piezoresistive elements) may comprise one or more electrical contacts (e.g. wire bonds) electrically coupled to the one or more sense elements. Typically, the electrical contacts may be utilized to electrically connect the sense die to the substrate. Additionally, in some embodiments, one or more bond pads may be supported by a first side of the sense die, and the one or more bond pads may be electrically coupled via the one or more electrical contacts to the sense die. Typically, the substrate may comprise bond pads for electrical connection with the one or more electrical contacts protruding from the sense die. In some embodiments, the location of the electrical contacts (e.g. wire bonds) may depend on the location of the one or more sense elements. As described previously, the sense elements may typically be located near the contact point between the actuation element and the sense die. This may allow the die sensitivities to increase leading to more accurate readings by the force sensor. Thus, the wire bonds may need to be located as close to the actuation element as possible without contacting the actuation element. In some cases, contact between the actuation element and the wire bonds may cause a shortage deeming the force sensor irreparable (or unworthy of repair). Thus, to prevent a shortage from occurring and to decrease the force sensor sizing for smaller packaging sizes, a thin wedge/plate can be used as an actuation element. Typically, the thickness of the thin wedge/plate may be less than the distance between the one or more wire bonds. In some embodiments, the ratio between the thickness of the thin wedge/plate and the distance between the wire bonds may be less than 1:2. In some embodiments, the ratio between the thickness of the thin wedge/plate and the distance between the wire bonds may be less than 1:3. In some embodiments, the ratio between the thickness of the thin wedge/plate and the distance between the wire bonds may be less than 1:4. In some embodiments, the ratio between the thickness of the thin wedge/plate and the distance between the wire bonds may be less than 1:7. In some embodiments, the wire bonds may not touch one another. Additionally, in some embodiments, the width of the thin wedge/plate may be less than the distance between the one or more wire bonds (for example, when the face of the thin wedge/plate comprises an ovular shape). In some embodiments, the width of the thin wedge/plate may be greater than the distance between the one or more wire bonds (for example, when the face of the thin wedge/plate comprises a circular shape).

In some embodiments, the back side of the sense die may be mounted to a top side of a substrate using an adhesive, solder, or the like. In this arrangement, the substrate may or may not, as desired, include an opening/aperture positioned under or above the back side of the sense die. In this instance, wire bonds may be provided to electrically connect bond pads on the front side of the sensing die, or bond pads at any other location on the sense die, to bond pads on the top side of the substrate and/or circuitry. In some cases, the sensing die may be provided in a package, and the package may be mounted to the substrate. In some cases, the substrate may include a ceramic material, however, it is contemplated that other suitable materials may be used in addition to or as an alternative to the ceramic material (e.g. PCB), as desired. For example, the substrate may be a thick film substrate.

In some embodiments, the force sensor may include a signal conditioning circuitry mounted on the substrate such that it may be in electrical communication with the sense die. The signal conditioning circuitry may be configured to receive one or more electrical signals from the one or more sense elements on the sense die, and condition the electrical signals to provide a conditioned output signal from the force sensor. The conditioned output signal may correct for repeatable variations, such as offset, sensitivity, non-linearity, temperature effects, and/or other variations. In some embodiments, the signal conditioning circuitry may include a microprocessor, a microcontroller, an ASIC (Application Specific Integrated Circuit), and/or an ASSP (Application Specific Standard Product). The signal conditioning circuitry may be mounted to the substrate using an adhesive or any other suitable bonding mechanism (e.g. solder, eutectic, etc.).

In some embodiments, the force sensor may comprise a structural frame. Typically, the structural frame may be configured to mount onto the top/first side of the substrate and may define a cavity around the sensing die, the signal conditioning circuitry, the one or more wire bonds, and at least part of the actuation element. In some embodiments, the structural frame may be formed from, for example, plastic, polyimide, ceramic, metal, or any other suitable material. In some embodiments, the structural frame may comprise an opening/aperture positioned over the sense die and the opening/aperture of the substrate. Typically, the actuation element may slightly project/protrude outward from the surface of the structural frame through the opening/aperture. In some embodiments, the structural frame may comprise an inwardly protruding body for holding the actuation element in place. In some embodiments, the actuation element may lay flush with the top of the structural frame. Typically, the inwardly protruding body may be formed around the opening/aperture of the structural frame such that the actuation element remains in place. While persons of skill should understand the disclosed embodiments based on the above disclosure, the following figures may provide specific examples that may further clarify the disclosure.

Figure 3:
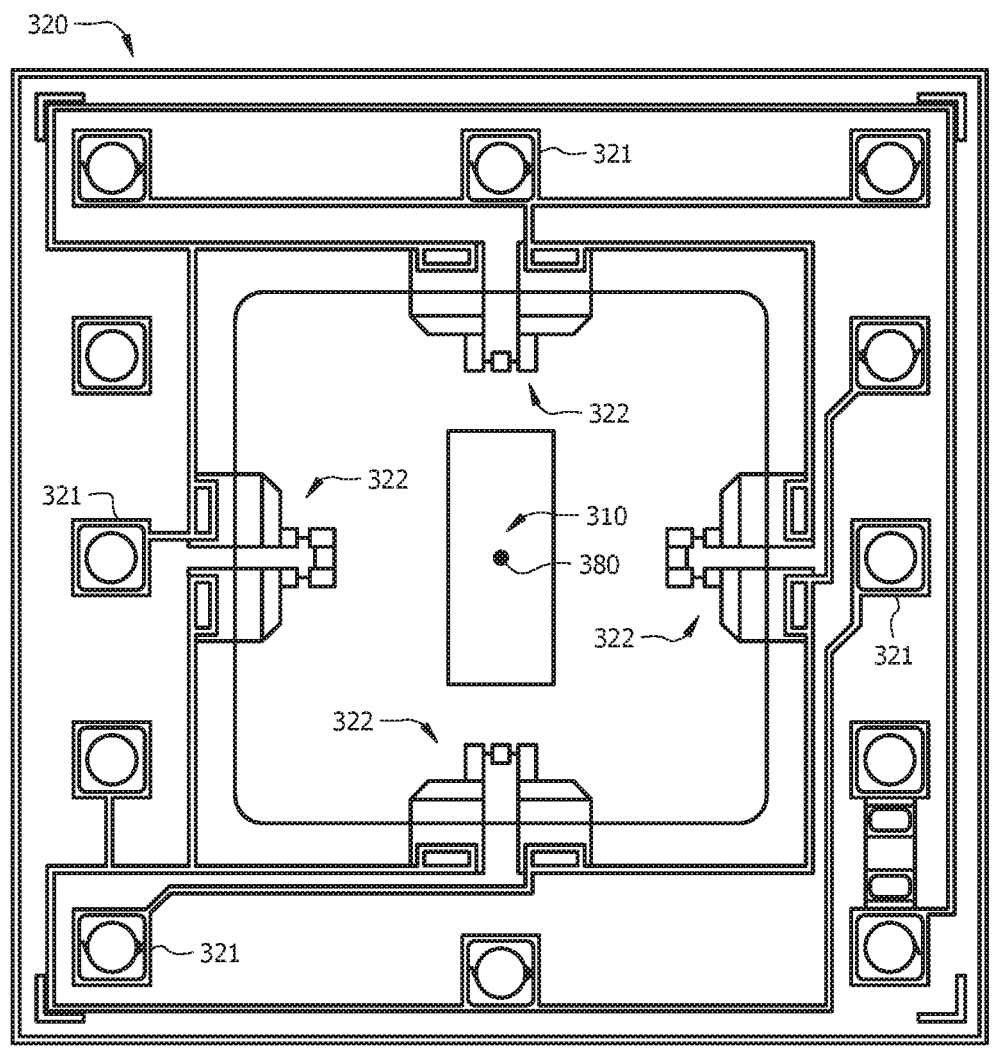
FIG. 3 illustrates a top, perspective view of an exemplary actuation element interacting with a sense die comprising one or more sense elements and one or more bond pads.

Turning now to the drawings, FIG. 1A illustrates a front, cross-sectional view of an exemplary embodiment of a force sensor 100 comprising an actuation element 110, a sense die 120, a signal conditioning circuitry 130, a housing or structural frame 150, and a substrate 140. Generally, the actuation element 110 may be configured to transmit a uniaxial force normal to the plane of the sense die 120. In the exemplary embodiment of FIG. 1A, the sense die 120 is a slab die comprising one or more sense elements (e.g., as shown in FIG. 3) disposed on or adjacent to the front side 123 of the sense die 120, such as piezoresistive sense elements (e.g., as shown in FIG. 3). Typically, the one or more sense elements may comprise one or more electrical contacts 160 (e.g. wire bonds) electrically coupled to the one or more sense elements. Generally, the sense elements may be located close to the contact point 180 between the actuation element 110 and the sense die 120. Typically, this may increase the die sensitivities and lead to a decrease in the size of the sense die 120.

In some embodiments, as in the embodiment shown in FIG. 1A, the force sensor 100 may further comprise a signal conditioning circuitry 130. Typically, the signal conditioning circuitry 130 may be configured to receive one or more electrical signals from the one or more sense elements on the sense die 120, and condition the electrical signals to provide a conditioned output signal from the force sensor 100. In the embodiment of FIG. 1A, the signal conditioning circuitry 130 receives electrical output signals directly from the one or more sense elements. Typically, the sense die 120 and the signal conditioning circuitry 130 may comprise bond pads to which the wire bonds 160 may electrically connect. In this manner, the wire bonds 160 may serve as the means of electrical communication between the sense die 120 and the signal conditioning circuitry 130. In some cases, when the signal conditioning circuitry 130 completes translating electrical signals to a conditioned output signal, the conditioned output signal may be transmitted to the substrate 140 via wire bonds 160. In some cases, the wire bonds 160 may interact with electrical traces 142 located on the substrate 140.

In the embodiment of FIG. 1A, the actuation element 110 is configured to contact the sense die 120 at the contact point 180. Typically, the actuation element 110 may comprise a circular face with rounded edges (e.g. similar to the cylindrical shape of a coin). Typically, the rounded edges may contact the surface of the sense die 120 to provide point, focalized force contact between the actuation element 110 and the sense die 120. Generally, using a thin wedge/plate as the actuation element 110 may allow the electrical contacts 160 (e.g. wire bonds) and the sense elements to be placed closer to the contact point 180 while ensuring there is enough space between the actuation element 110 and the wire bonds 160 to prevent accidental shortage.

Additionally, as shown in the embodiment of FIG. 1A, the back side 124 of the sense die 120 and the back side of the signal conditioning circuitry 130 may be mounted on the substrate 140 using an adhesive 170 or any other suitable bonding mechanism (e.g. solder, eutectic, etc.). In some embodiments, the substrate 140, the signal conditioning circuitry 130, and the sense die 120 may be in electrical communication with each other. It is important to note that the configuration and placement of the sense die 120 and the signal conditioning circuitry 130 may vary in different embodiments while accomplishing the same purpose. It is also important to note that the electrical signals may be transmitted to the signal conditioning circuitry 130 for conditioning and then the conditioned output signal may be transmitted to the substrate 140. However, in some embodiments, the electrical signals may be transmitted to the substrate 140 and then the electrical signals may be transmitted to the signal conditioning circuitry 130 via the substrate 140. For example, the signal conditioning circuitry 130 may be placed on the bottom side 144 of the substrate 140. In that case, the electrical signals may be transmitted to the signal conditioning circuitry 130 through the substrate 140. Additionally, the bottom side 144 of the substrate 140 may or may not comprise a housing structural frame to protect (e.g. prevent damage to) the signal conditioning circuitry 130. In some embodiments, the bottoms side 144 of the substrate 140 can be further coupled to another substrate such as a circuit board forming part of a larger component or device.

In the embodiment of FIG. 1A, the force sensor 100 comprises a housing or a structural frame 150. The structural frame 150 can be mounted onto the top side 143 of the substrate 140 and can define a cavity around the perimeter of the substrate 140. The structural frame 150 is shown to comprise an inwardly protruding body 152 for holding the actuation element 110 in place. In the embodiment of FIG. 1A, the inwardly protruding body 152 is formed around the opening/aperture 151 of the structural frame 150 such that the actuation element 110 is held in place. Typically, the structural frame 150 protects the elements within the force sensor 100 from external damage. Additionally, as shown in the embodiment of FIG. 1A, the substrate 140 includes an opening/aperture 141 positioned under the back side 124 of the sense die 120.

Figure 1B:
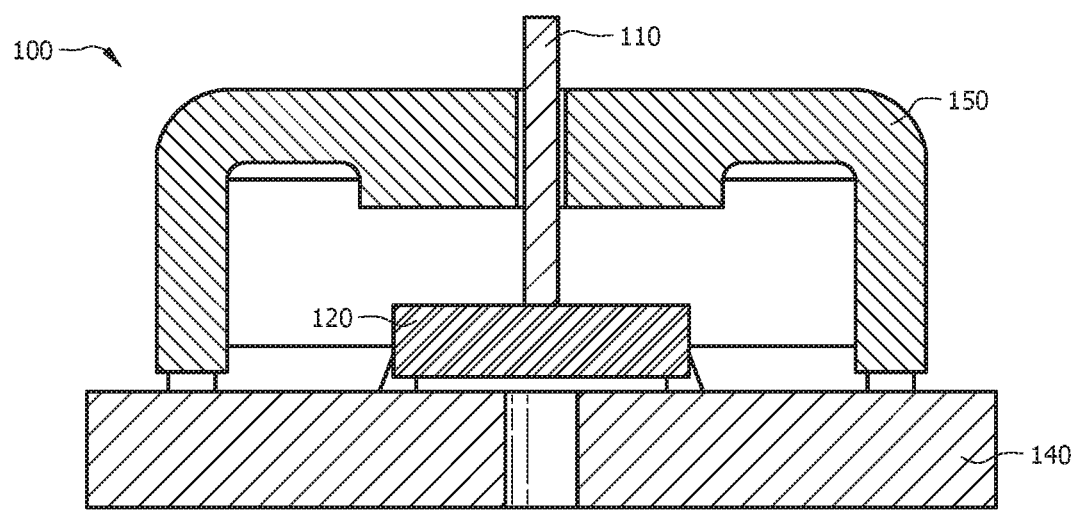
FIG. 1B illustrates a side, cross-sectional view of an exemplary embodiment of a force sensor (similar to the exemplary embodiment shown in FIG. 1A) comprising an actuation element, a sense die, a structural frame, and a substrate.

FIG. 1B illustrates a side, cross-sectional view of an exemplary embodiment of a force sensor 100 (similar to the exemplary embodiment shown in FIG. 1A) comprising an actuation element 110, a sense die 120, a structural frame 150, and a substrate 140. Generally, the elements of the exemplary force sensor 100 shown in FIG. 1B may operate in a similar manner to the elements of the exemplary force sensor 100 shown in FIG. 1A described above. In the embodiment of FIG. 1B, a side perspective of the force sensor 100 is shown. This perspective illustrates the actuation element 110 as a thin wedge/plate. Typically, the edges may be rounded (for example, as the edges of a coin are rounded). The exemplary actuation element 100 of FIG. 1B may lead to a decrease in the size of the sense die 120. Additionally, with a thin wedge/plate shape, the one or more sense elements may be located closer to actuation element 110 leading to increased die sensitivities. With this configuration, smaller force sensors may be manufactured for implementation into applications requiring smaller packaging sizes such as the medical industry.

Figure 1C:
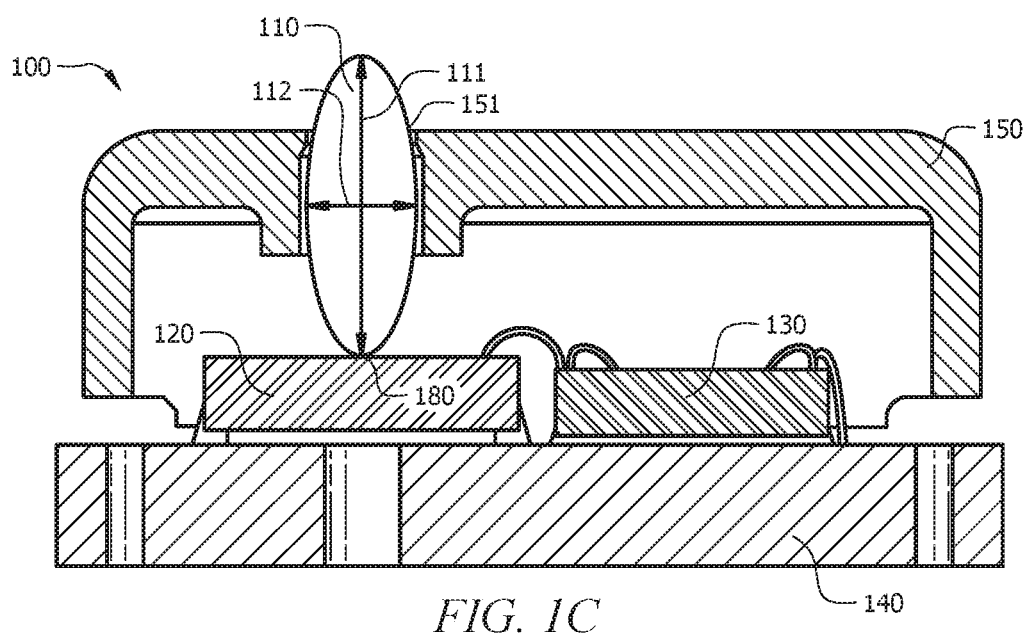
FIG. 1C illustrates an alternative, front, cross-sectional view of an exemplary embodiment of a force sensor (similar to the exemplary embodiments shown in FIG. 1A and FIG. 1B) comprising an actuation element, a sense die, a signal conditioning circuitry, a structural frame, and a substrate.

FIG. 1C illustrates an alternative, front, cross-sectional view of an exemplary embodiment of a force sensor 100 (similar to the exemplary embodiments shown in FIG. 1A and FIG. 1B) comprising an actuation element 100, a sense die 120, a signal conditioning circuitry 130, a structural frame 150, and a substrate 140. Generally, the elements of the exemplary force sensor 100 shown in FIG. 1C may operate in a similar manner to the elements of the exemplary force sensor 100 shown in FIG. 1A and FIG. 1B. However, in the embodiment of FIG. 1C, the actuation element 110 comprises an ovular face (with rounded edges at both ends of the actuation element 110). However, in some embodiments, the actuation element 110 may typically comprise a rounded edge at the end configured to interact with the sense die 120. The other end of the thin wedge/plate may comprise a different shape (e.g. conical, rounded, flat, T-shaped, etc.) or the same shape. In some embodiments, the thin wedge/plate may vary in length to accommodate the distance between the opening/aperture 151 of the structural frame 150 and the contact point 180 on the sense die 120. Typically, the height 111 of the actuation element 110 may be greater than the width 112 of the actuation element 110, and the thickness of the edges may generally be less than both the height 111 and width 112 of the actuation element 110.

Figure 2A:
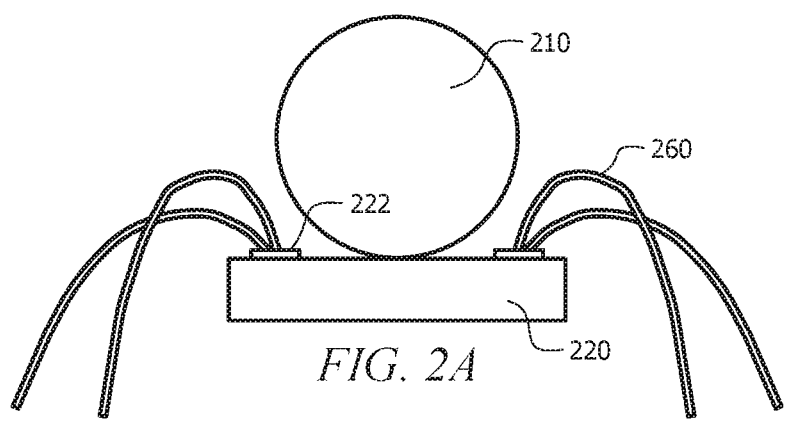
FIG. 2A-FIG. 2C illustrate a front view of exemplary embodiments of a conventional force sensor configuration comprising an actuation element, a sense die, one or more electrical contacts, and one or more sense elements.
Figure 2B:
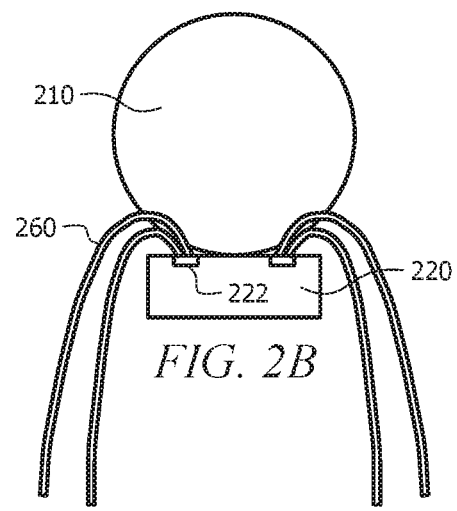
Figure 2C:
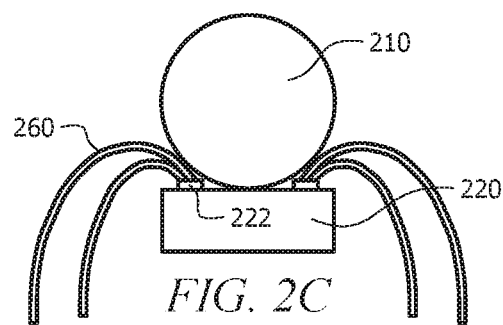

FIG. 2A-FIG. 2C illustrate a front view of exemplary embodiments of a conventional force sensor configuration comprising an actuation element 210, a sense die 220, one or more electrical contacts 260, and one or more sense elements 222. Conventionally, the actuation element 210 is a spherical ball bearing configured to interact with the surface of a sense die 220. Typically, the size of the sense die 220 may depend on the size of the actuation element 210. In the exemplary embodiment of FIG. 2A, the sense die 220 is larger than the sense die 220 in the exemplary embodiments of FIG. 2B and FIG. 2C. Generally, to accommodate the large size of the actuation element 210 and to ensure the one or more electrical contacts 260 do not touch/interact with the actuation element 210, the sense die 220 may have a larger surface area. However, in many recent applications, there is a greater desire for smaller force sensors for applications requiring smaller packaging sizes. Thus, as shown in the embodiment of FIG. 2B, the sense die 220 may need to become smaller. However, in the embodiment of FIG. 2B, the spherical ball bearing comes into contact with the one or more electrical contacts 260 (e.g. wire bonds) which may increase the chances of breakage or failure of the force sensor. In the embodiment of FIG. 2C, both the actuation element 210 and the sense die 220 are shown to be reduced in size. This may increase the precision required to manufacture the structural frame of the force sensor (e.g. precision and costs required to bear, handle, and mold the thin walls of the structural frame). Typically, this drawback may result due to the shortened distance between the top of the spherical ball bearing and the bottom of the spherical ball bearing. For this reason, the Applicants have implemented the use of a thin wedge/plate as shown in the exemplary embodiments of FIG. 1A-FIG. 1C.

FIG. 3 illustrates a top perspective view of an exemplary actuation element 310 interacting with a sense die 320 comprising one or more sense elements 322 and one or more bond pads 321. In the exemplary embodiment of FIG. 3, the actuation element 310 is a thin wedge/plate. Typically, with a thin wedge/plate shape, the actuation element 310 may provide point, focalized force contact to the sense die 320. This may allow the sense elements 322 to be located closer to the contact point 380 between the sense die 320 and the actuation element 310. Typically, the closer the sense elements 322 are located to the actuation element 310, the better the die sensitivities may be. In this manner, the force sensor may obtain more accurate readings. Additionally, with sense elements 322 located closer to the contact point 380, the sense die 320 may decrease in size and cost (e.g. less silicon and/or other material used to form the sense die

320, smaller structural frame required, lower costs to stamp and mold an actuation element 310 (e.g. thin wedge/plate)).

Having described device embodiments above, especially with regard to the figures, various additional embodiments can include, but are not limited to the following:

In a first embodiment, a force sensor comprising: a sense die (including a front side and a back side); a substrate (located adjacent to the sense die); one or more sense elements supported by the sense die; one or more electrical contacts (e.g. wire bonds) (located about the contact point of the actuation element to the sense die and) located on the sense die and electrically coupled to electrical traces on the substrate; and an actuation element configured to transmit a force to the sense die, wherein the width of the actuation element is less than the distance between the one or more electrical contacts [the thickness of the actuation element is less than the distance between the one or more electrical contacts]. A second embodiment can include the force sensor of the first embodiment, wherein the substrate comprises an opening extending from a top side of the substrate to a bottom side of the substrate. A third embodiment can include the force sensor of the first to second embodiments, wherein the sense die is mounted above the opening in the substrate. A fourth embodiment can include the force sensor of the first to third embodiments, wherein the sense die is mounted to the substrate using an adhesive or solder. A fifth embodiment can include the force sensor of the first to fourth embodiments, wherein the sense die is comprised of silicon (or other semiconductor material). A sixth embodiment can include the force sensor of the first to fifth embodiments, wherein the substrate is formed from at least one of a ceramic board (e.g. ceramic thick film) or a laminated board. A seventh embodiment can include the force sensor of the first to sixth embodiments, wherein the sense elements comprise piezoelectric elements. An eighth embodiment can include the force sensor of the first to seventh embodiments, further comprising a structural frame positioned/mounted on the top side of the substrate. A ninth embodiment can include the force sensor of the first to eighth embodiments, wherein the structural frame comprises an opening/aperture positioned over the opening in the substrate. A tenth embodiment can include the force sensor of the first to ninth embodiments, further comprising signal conditioning circuitry mounted on the substrate in electrical communication with the sensing die. An eleventh embodiment can include the force sensor of the first to tenth embodiments, wherein the structural frame at least partially covers the sense die and at least one of the signal conditioning circuitry. A twelfth embodiment can include the force sensor of the first to eleventh embodiments, wherein the signal conditioning circuitry is configured to receive an electrical output signal from the sensing die and condition the electrical output signal to provide a conditioned output signal from the force sensor. A thirteenth embodiment can include the force sensor of the first to twelfth embodiments, further comprising at least one of an application-specific integrated circuit (ASIC) and an application-specific standard product (ASSP) mounted on the substrate. A fourteenth embodiment can include the force sensor of the first to thirteenth embodiments, wherein the sensing die and the at least one of the ASIC and ASSP are wire bonded to the substrate. A fifteenth embodiment can include the force sensor of the first to fourteenth embodiments, wherein the actuation element is formed from a metal, a ceramic, a polymer, or any combination thereof. A sixteenth embodiment can include the force sensor of the first to fifteenth embodiments, wherein the face of the actuation element comprises a circular or ovular shape, wherein the edges of the actuation element are configured to be rounded, and wherein the edges of the actuation element are configured to interact with the contact point (to provide focalized contact). A seventeenth embodiment can include the force sensor of the first to sixteenth embodiments, wherein the face of the actuation element spans a larger width than the edges of the actuation element. An eighteenth embodiment can include the force sensor of the first to seventeenth embodiments, wherein the length of the actuation element is equal to or longer than the width of the actuation element, wherein the length of the actuation element depends on the distance between the contact point located on the sense die and the opening/aperture of the structural frame, and wherein the actuation element is configured to project outward from the opening/aperture of the structural frame. A nineteenth embodiment can include the force sensor of the first to eighteenth embodiments, wherein a first end of the actuation element is retained between the opening in the structural frame and a second end of the actuation element is disposed in contact with the front side of the sense die. A twentieth embodiment can include the force sensor of the first to nineteenth embodiments, wherein the structural frame comprises an inwardly protruding body (defining a chamber) for holding the actuation element in place. A twenty-first embodiment can include the force sensor of the first to twentieth embodiments, wherein the sense die comprises a sense diaphragm configured to deflect to provide an indication of a force imposed on the sense diaphragm. A twenty-second embodiment can include the force sensor of the first to twenty-first embodiments, wherein the distance between the one or more sense elements is centered about the contact point between the actuation element and the sense die. A twenty-third embodiment can include the force sensor of the first to twenty-second embodiments, further comprising one or more bond pads, wherein the one or more electrical contacts is electrically coupled to the one or more bond pads. A twenty-fourth embodiment can include the force sensor of the first to twenty-third embodiments, wherein the sense die comprises an etched cavity on the back side of the sense die. A twenty-fifth embodiment can include the force sensor of the first to twenty-fourth embodiments, wherein the sense die is flip chip mounted to the substrate. A twenty-sixth embodiment can include the force sensor of the first to twenty-fifth embodiments, wherein the sense die comprises a chip comprising a slab.

Exemplary embodiments might also relate to a method for sensing force using a force sensor assembly (e.g. similar to those described above, which may be considered optionally incorporated herein with respect to the discussion of the system). Such method embodiments, for example, might include, but are not limited to, the following:

In a twenty-seventh embodiment, a method of sensing a force using a force sensor, the method comprising: applying a force to the force sensor, the force sensor comprising an actuation element configured to transmit a force to a sense die, wherein the sense die comprises one or more sense elements; detecting a force increase by the one or more sense elements of the sense die; at least partially contacting the sense die at the contact point by the actuation element; (deflecting at least a portion of the one or more sense elements due to the force); and transmitting, by the sense die, an electrical output signal. A twenty-eighth embodiment can include the method of the twenty-seventh embodiment, further comprising: receiving, by a signal conditioning circuitry, the electrical output signal from the sense die; and conditioning, by the signal conditioning circuitry, the electrical output signal to provide a conditioned output signal. A twenty-ninth embodiment can include the method of the twenty-seventh to twenty-eighth embodiments, wherein the force sensor comprises: a sense die (including a front side and a back side); a substrate (located adjacent to the sense die); one or more sense elements supported by the sense die; one or more electrical contacts (e.g. wire bonds) (located about the contact point of the actuation element to the sense die and) located on the sense die and electrically coupled to electrical traces on the substrate; and an actuation element configured to transmit a force to the sense die, wherein the width of the actuation element is less than the distance between the one or more electrical contacts [the thickness of the actuation element is less than the distance between the one or more electrical contacts]. A thirtieth embodiment can include the method of the twenty-seventh to twenty-ninth embodiments, wherein the substrate comprises an opening extending from a top side of the substrate to a bottom side of the substrate. A thirty-first embodiment can include the method of the twenty-seventh to thirtieth embodiments, wherein the sense die is mounted above the opening in the substrate. A thirty-second embodiment can include the method of the twenty-seventh to thirty-first embodiments, wherein the sense die is mounted to the substrate using an adhesive or solder. A thirty-third embodiment can include the method of the twenty-seventh to thirty-second embodiments, wherein the sense die is comprised of silicon (or other semiconductor material). A thirty-fourth embodiment can include the method of the twenty-seventh to thirty-third embodiments, wherein the substrate is formed from at least one of a ceramic board (e.g. ceramic thick film) or a laminated board. A thirty-fifth embodiment can include the method of the twenty-seventh to thirty-fourth embodiments, wherein the sense elements comprise piezoelectric elements. A thirty-sixth embodiment can include the method of the twenty-seventh to thirty-fifth embodiments, further comprising a structural frame positioned/mounted on the top side of the substrate. A thirty-seventh embodiment can include the method of the twenty-seventh to thirty-sixth embodiments, wherein the structural frame comprises an opening/aperture positioned over the opening in the substrate. A thirty-eighth embodiment can include the method of the twenty-seventh to thirty-seventh embodiments, further comprising signal conditioning circuitry mounted on the substrate in electrical communication with the sensing die. A thirty-ninth embodiment can include the method of the twenty-seventh to thirty-eighth embodiments, wherein the structural frame at least partially covers the sense die and at least one of the signal conditioning circuitry. A fortieth embodiment can include the method of the twenty-seventh to thirty-ninth embodiments, wherein the signal conditioning circuitry is configured to receive an electrical output signal from the sensing die and condition the electrical output signal to provide a conditioned output signal from the force sensor. A forty-first embodiment can include the method of the twenty-seventh to fortieth embodiments, further comprising at least one of an application-specific integrated circuit (ASIC) and an application-specific standard product (ASSP) mounted on the substrate. A forty-second embodiment can include the method of the twenty-seventh to forty-first embodiments, wherein the sensing die and the at least one of the ASIC and ASSP are wire bonded to the substrate. A forty-third embodiment can include the method of the twenty-seventh to forty-second embodiments, wherein the actuation element is formed from a metal, a ceramic, a polymer, or any combination thereof. A forty-fourth embodiment can include the method of the twenty-seventh to forty-third embodiments, wherein the face of the actuation element comprises a circular or ovular shape, wherein the edges of the actuation element are configured to be rounded, and wherein the edges of the actuation element are configured to interact with the contact point (to provide focalized contact). A forty-fifth embodiment can include the method of the twenty-seventh to forty-fourth embodiments, wherein the face of the actuation element spans a larger width than the edges of the actuation element. A forty-sixth embodiment can include the method of the twenty-seventh to forty-fifth embodiments, wherein the length of the actuation element is equal to or longer than the width of the actuation element, wherein the length of the actuation element depends on the distance between the contact point located on the sense die and the opening/aperture of the structural frame, and wherein the actuation element is configured to project outward from the opening/aperture of the structural frame. A forty-seventh embodiment can include the method of the twenty-seventh to forty-sixth embodiments, wherein a first end of the actuation element is retained between the opening in the structural frame and a second end of the actuation element is disposed in contact with the front side of the sense die. A forty-eighth embodiment can include the method of the twenty-seventh to forty-seventh embodiments, wherein the structural frame comprises an inwardly protruding body (defining a chamber) for holding the actuation element in place. A forty-ninth embodiment can include the method of the twenty-seventh to forty-eighth embodiments, wherein the sense die comprises a sense diaphragm configured to deflect to provide an indication of a force imposed on the sense diaphragm. A fiftieth embodiment can include the method of the twenty-seventh to forty-ninth embodiments, wherein the distance between the one or more sense elements is centered about the contact point between the actuation element and the sense die. A fifty-first embodiment can include the method of the twenty-seventh to fiftieth embodiments, further comprising one or more bond pads, wherein the one or more electrical contacts is electrically coupled to the one or more bond pads. A fifty-second embodiment can include the method of the twenty-seventh to fifty-first embodiments, wherein the sense die comprises an etched cavity on the back side of the sense die. A fifty-third embodiment can include the method of the twenty-seventh to fifty-second embodiments, wherein the sense die is flip chip mounted to the substrate. A fifty-fourth embodiment can include the method of the twenty-seventh to fifty-third embodiments, wherein the sense die comprises a chip comprising a slab.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification, and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A three sensor comprising:
    a sense die including a front side and a back side;
    a substrate located adjacent to the sense die;
    one or more sense elements supported by the sense die;
    one or more electrical contacts located on the sense die and electrically coupled to electrical traces on the substrate; and
    an actuation element configured to transmit a force to the sense die, wherein the width of the actuation element is less than the distance between the one or more electrical contacts, wherein the actuation element is a plate.

2. The force sensor of claim 1, wherein the substrate comprises an aperture extending from a top side of the substrate to a bottom side of the substrate, and wherein the substrate is formed from at least one of a ceramic board or a laminated board.

3. The force sensor of claim 1, wherein the sense die is mounted above the aperture in the substrate.

4. The force sensor of claim 3, wherein the sense die is mounted to the substrate using an adhesive or solder.

5. The force sensor of claim 3, wherein the sense die is comprised of silicon or other semiconductor material.

6. The force sensor of claim 1, wherein the sense elements comprise piezoelectric elements.

7. The force sensor of claim 1, further comprising signal conditioning circuitry mounted on the substrate in electrical communication with the sensing die, and wherein the signal conditioning circuitry is configured to receive an electrical output signal from the sensing die and condition the electrical output signal to provide a conditioned output signal from the force sensor.

8. The force sensor of claim 1, further comprising a structural frame mounted on the top side of the substrate, and wherein the structural frame at least partially covers the sense die and at least one of the signal conditioning circuitry.

9. The force sensor of claim 8, wherein the structural frame comprises an opening positioned over the aperture in the substrate.

10. The force sensor of claim 7, further comprising at least one of an application-specific integrated circuit (ASIC) and an application-specific standard product (ASSP) mounted on the substrate, and wherein the sensing die and the at least one of the ASIC and ASSP are wire bonded to the substrate.

11. The force sensor of claim 1, wherein the sense die is a slab die.

12. The force sensor of claim 1, wherein the edges of the actuation element are configured to be rounded, and wherein the edges of the actuation element are configured to interact with the contact point on the sense die.

13. The force sensor of claim 12, wherein the face of the actuation element spans a larger width than the edges of the actuation element.

14. The force sensor of claim 12, wherein the height of the actuation element is equal to or longer than the width of the actuation element, wherein the height of the actuation element depends on the distance between the contact point located on the sense die and the opening of the structural frame, and wherein the actuation element is configured to project outward from the opening of the structural frame.

15. The force sensor of claim 12, wherein a first end of the actuation element is retained between the opening in the structural frame and a second end of the actuation element is disposed in contact with the front side of the sense die.

16. The force sensor of claim 8, wherein the structural frame comprises an inwardly protruding body for holding the actuation element in place.

17. The force sensor of claim 6, wherein the distance between the one or more sense elements is centered about the contact point between the actuation element and the sense die.

18. The force sensor of claim 1, further comprising one or more bond pads, wherein the one or more electrical contacts is electrically coupled to the one or more bond pads.

19. A method of sensing a force using a force sensor, the method comprising:
- applying a force to the force sensor, the force sensor comprising an actuation element configured to transmit a force to a sense die, wherein the sense die comprises one or more sense elements, wherein the actuation element is a plate;
- detecting a force increase by the one or more sense elements of the sense die;
- at least partially contacting the sense die at the contact point by the actuation element;
- deflecting at east a portion of the one or more sense elements due to the force; and
- transmitting, by the sense die, an electrical output signal.

20. The method of claim 19, further comprising:
- receiving, by a signal conditioning circuitry, the electrical output signal from the sense die; and
- conditioning, by the signal conditioning circuitry, the electrical output signal to provide a conditioned output signal.

* * * * *